(12) United States Patent
Zhe et al.

(10) Patent No.: US 8,178,936 B2
(45) Date of Patent: *May 15, 2012

(54) DOUBLE-SIDE MOUNTABLE MEMS PACKAGE

(75) Inventors: Wang Zhe, Singapore (SG); Chong Ser Choong, Singapore (SG)

(73) Assignee: Shandong Gettop Acoustic Co. Ltd., Shandong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 12/927,122

(22) Filed: Nov. 8, 2010

(65) Prior Publication Data

US 2011/0062573 A1    Mar. 17, 2011

Related U.S. Application Data

(63) Continuation of application No. 12/072,890, filed on Feb. 28, 2008, now Pat. No. 7,843,021.

(51) Int. Cl.
*H01L 21/00* (2006.01)
*H01L 29/84* (2006.01)

(52) U.S. Cl. ............... 257/416; 438/51; 438/55; 438/64; 257/E31.024; 257/E31.069; 257/E21.506

(58) Field of Classification Search ................... 438/51, 438/55, 64; 257/416, E31.024, E31.169, 257/E21.506
See application file for complete search history.

(56) References Cited

U.S. PATENT DOCUMENTS

| | | | |
|---|---|---|---|
| 7,202,552 B2 | 4/2007 | Zhe et al. |
| 7,242,089 B2 | 7/2007 | Minervini |
| 7,436,054 B2 | 10/2008 | Zhe |
| 7,692,288 B2 | 4/2010 | Zhe et al. |

FOREIGN PATENT DOCUMENTS

WO    WO 2005/086532    9/2005

*Primary Examiner* — David Zarneke
(74) *Attorney, Agent, or Firm* — Saile Ackerman LLC; Stephen B. Ackerman; Rosemary L. S. Pike

(57) ABSTRACT

The MEMS package has a mounting substrate on which one or more transducer chips are mounted wherein the mounting substrate has an opening. A top cover is attached to and separated from the mounting substrate by a spacer forming a housing enclosed by the top cover, the spacer, and the mounting substrate and accessed by the opening. Electrical connections are made between the one or more transducer chips and the mounting substrate and/or between the one or more transducer chips and the top cover. A bottom cover can be mounted on a bottom surface of the mounting substrate wherein a hollow chamber is formed between the mounting substrate and the bottom cover, wherein a second opening in the bottom cover is not aligned with the first opening. Pads on outside surfaces of the top and bottom covers can be used for further attachment to printed circuit boards. The top and bottom covers can be a flexible printed circuit board folded under the mounting substrate.

38 Claims, 13 Drawing Sheets

400
DOUBLE-SIDE MOUNTABLE MEMS PACKAGE

This application is a Continuation application of U.S. application Ser. No. 12/072,890, filed on Feb. 28, 2008, now U.S. Pat. No. 7,843,021 assigned to a common assignee and herein incorporated by reference in its entirety.

BACKGROUND OF THE INVENTION (1) Field of the Invention

The invention relates to processes for packaging MEMS devices, and MEMS packages produced using the method, and more particularly, to a method of packaging MEMS devices having cost-effective electrical interconnections and a sufficient acoustic chamber.

(2) Description of the Related Art

Micro-electro-mechanical systems (MEMS) devices are known which convert physical phenomena, such as pressure, acceleration, sound, or light, into electrical signals. Each type of MEMS device interacts with the world in a different way, and demands custom or at least semi-custom packaging solutions. So-called system-in-package techniques attempt to form an entire microsystem—which could include a microprocessor, communications components, actuators and sensors—within a single package. However, packaging of a MEMS device is totally different from packaging an integrated circuit device. MEMS devices are categorically different from ICs despite sharing some fundamental processing technologies. Packaging is the biggest challenge for commercializing most MEMS devices. The term "MEMS package" is used in this document to imply a package including at least one MEMS device.

The packaging requirements of a MEMS microphone or acoustic sensor are complex because the devices need to have an open path to receive sound pressure and yet the devices need to be protected from external environmental hazards like particles, dust, corrosive gases and humidity. In addition, the device must have an acoustic chamber to be functional. A sufficient acoustic chamber is an essential requirement to guarantee the desired performance of any microphone/acoustic sensor. An insufficient acoustic chamber will damp the diaphragm movement and increase the acoustic noise. In considerations of packaging a MEMS microphone, it is also desired to avoid expensive process, substrate, and packaging materials.

For example, FIG. 1 illustrates a MEMS package as disclosed in PCT patent application PCT/US2005/006565, assigned to Tessera. An opening for external energy is shown at the top of the figure over the MEMS device. This opening directly faces the external environment and could result in exposure of the MEMS device to environmental hazards such as particles, dust, corrosive gases, and humidity. Surface Mount Technology (SMT) pads for external connection 132 are shown. Isolated via connections 136 to the SMT pads cannot form a good seal.

FIGS. 2A and 2B illustrate two examples of a MEMS package as disclosed in U.S. Pat. No. 7,242,089 (Minervini). The acoustic chamber 18 is of insufficient size due to the constraint of package height since it is formed within the substrate. This patent also discloses an expensive multi-layer PCB to create the required back chamber under the MEMS sensing element.

U.S. Pat. No. 7,202,552 (Zhe et al) teaches methods of using flexible printed circuit boards and folding processes to make MEMS packages. However, the MEMS die may be exposed to external environmental hazards using this method.

Co-pending U.S. patent application Ser. No. 11/333,579, filed on Jan. 17, 2006, and herein incorporated by reference in its entirety, discloses the use of a metal meshed hole for environmental protection, but the flexible printed circuit board and processing costs are still high.

Co-pending U.S. Patent Application 2007/0205492 (Wang Zhe), assigned to the same assignee as the present invention and herein incorporated by reference in its entirety, shows a hollow chamber between two PCB's underlying the MEMS device. An opening in the second PCB is not aligned with the MEMS device.

SUMMARY OF THE INVENTION

A principal object of the present invention is to provide a cost-effective and very manufacturable method of packaging MEMS devices wherein the package can be mounted to a printed circuit board on the top or the bottom of the package.

Another object of the invention is to provide a MEMS microphone package wherein the package can be mounted to a printed circuit board on the top or bottom of the package.

Another object of the present invention is to provide a cost-effective and very manufacturable method of packaging MEMS devices having cost-effective electrical interconnections and a sufficient acoustic chamber.

Another object of the invention is to provide a MEMS microphone package having cost-effective electrical interconnections and a sufficient acoustic chamber.

Yet another object of the invention is to provide a cost-effective and very manufacturable method of packaging MEMS devices having cost-effective electrical interconnections and a sufficient acoustic chamber wherein the package can be mounted to a printed circuit board on the top or the bottom of the package.

A further object is to provide a MEMS microphone package having cost-effective electrical interconnections and a sufficient acoustic chamber wherein the package can be mounted to a printed circuit board on the top or the bottom of the package.

In accordance with the objects of this invention an improved MEMS package is achieved. The MEMS package has a mounting substrate on which one or more transducer chips are mounted wherein the mounting substrate has an opening. A top cover is attached to and separated from the mounting substrate by a spacer forming a housing enclosed by the top cover, the spacer, and the mounting substrate and accessed by the opening. Electrical connections are made between the one or more transducer chips and the mounting substrate and/or between the one or more transducer chips and the top cover.

Also in accordance with the objects of this invention, another MEMS package is achieved. The MEMS package has a mounting substrate on which one or more transducer chips are mounted wherein the mounting substrate has a first opening. A top cover overlies and is attached to, and separated from the mounting substrate by a spacer. A bottom cover underlies and is joined to the mounting substrate wherein a gap is formed between the bottom cover and the substrate. Electrical connections are between the one or more transducer chips and the mounting substrate and/or between the one or more transducer chips and the top cover.

Also in accordance with the objects of this invention, another MEMS package is achieved. The MEMS package comprises a mounting substrate on which one or more transducer chips are mounted wherein the mounting substrate has a first opening. A top cover overlies and is attached to, and separated from the mounting substrate by a spacer. A bottom cover underlies and is joined to the mounting substrate wherein a gap is formed between the bottom cover and the mounting substrate wherein the gap joins the first opening and the second opening and wherein the first opening is not aligned with the second opening. Electrical connections are made between the one or more transducer chips and the mounting substrate, and/or the one or more transducer chips and the top cover, and/or the one or more transducer chips and the bottom cover. Pads on outside surfaces of the top and bottom covers can be used for further attachment to printed circuit boards.

Also in accordance with the objects of this invention a method of producing an improved MEMS package is achieved. A mounting substrate is provided having a first opening. One or more transducer chips are mounted on a top surface of the mounting substrate. A top cover overlies and is attached to, and separated from, the mounting substrate by a spacer forming a housing enclosed by the top cover, the spacer, and the mounting substrate and accessed by the first opening. Electrical connections are made between the one or more transducer chips and the mounting substrate and/or the one or more transducer chips and the top cover. Optionally, a bottom cover is mounted on a bottom surface of the mounting substrate wherein a hollow chamber is formed between the mounting substrate and the bottom cover, wherein a second opening in the bottom cover allows external fluid, acoustic energy or pressure to enter the hollow chamber, wherein the second opening is not aligned with the first opening.

Also in accordance with the objects of this invention a method of producing an improved MEMS package is achieved. A mounting substrate is provided having a first opening. One or more transducer chips are mounted on a top surface of the mounting substrate. A flexible printed circuit board with a second opening overlies and is attached to, and separated from, the mounting substrate by a spacer forming a housing enclosed by the top cover, the spacer, and the mounting substrate and accessed by the first opening. Electrical connections are made between the one or more transducer chips and the mounting substrate and/or the one or more transducer chips and the flexible printed circuit board. The flexible printed circuit board is further folded over the package and secured on the bottom of the mounting substrate using adhesives wherein a hollow chamber is formed between the mounting substrate and the flexible printed circuit board, wherein a second opening in the flexible printed circuit board allows external fluid, acoustic energy or pressure to enter the hollow chamber and the first opening, wherein the second opening is not aligned with the first opening.

Also in accordance with the objects of this invention a method of producing an improved MEMS package is achieved. A mounting substrate is provided having a first opening. One or more transducer chips are mounted on a top surface of the mounting substrate. A flexible printed circuit board with a second opening overlies and is attached to, and separated from, the mounting substrate by a spacer forming a housing enclosed by the top cover, the spacer, and the mounting substrate wherein a second opening in the flexible printed circuit board allows external fluid, acoustic energy or pressure to enter the housing. Electrical connections are made between the one or more transducer chips and the mounting substrate and/or the one or more transducer chips and the flexible printed circuit board. The flexible printed circuit board is further folded over the package and secured on the bottom of the mounting substrate using adhesives wherein a hollow chamber is formed between the mounting substrate and the flexible printed circuit board.

BRIEF DESCRIPTION OF THE DRAWINGS

In the accompanying drawings forming a material part of this description, there is shown.

DESCRIPTION OF THE PREFERRED EMBODIMENTS

The present invention proposes a method for packaging a MEMS microphone or sensor device. One or more electronic components could also be included in the package. The present invention provides cost-effective electrical interconnections between an integrated circuit chip and the Surface Mount Technology (SMT) pads for connection between the package and the printed circuit board. In addition, the MEMS packages and method of fabricating the MEMS packages provide sufficient back chamber for the MEMS acoustic sensor and protection of the MEMS device from external environmental hazards while avoiding expensive substrate and packaging materials.

Figure 1:
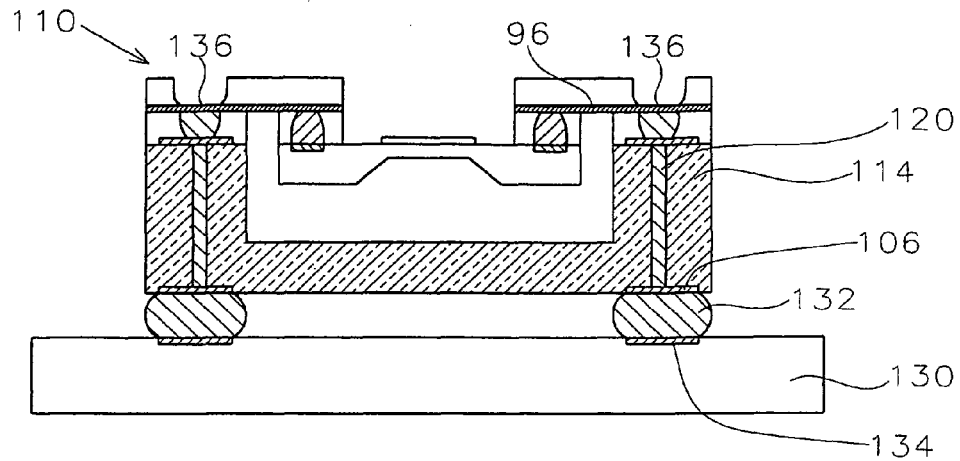
FIGS. 1, 2A, and 2B schematically illustrate in cross-sectional representation MEMS package concepts of the prior art.
Figure 2A:
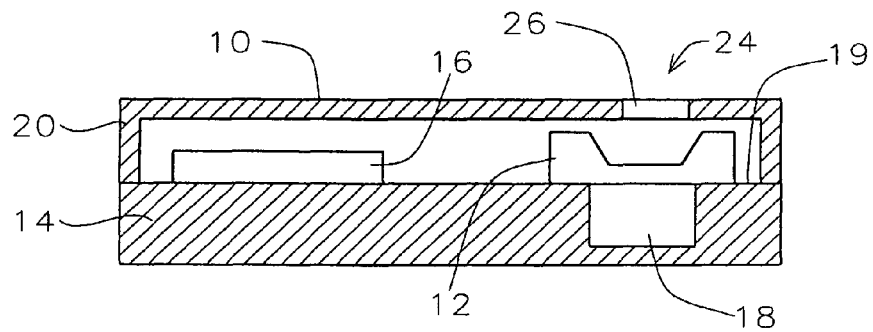
Figure 2B:
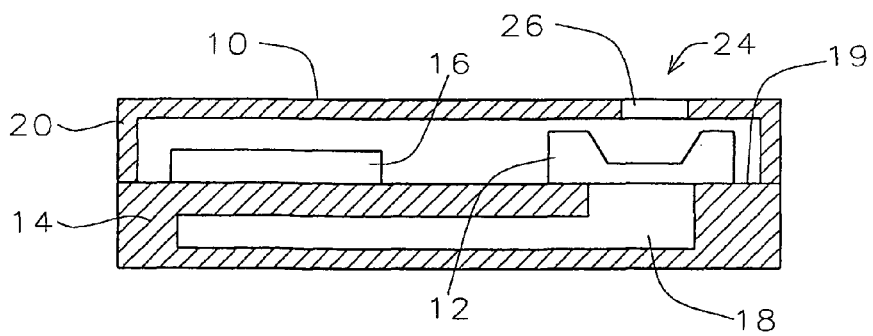
Figure 3A:
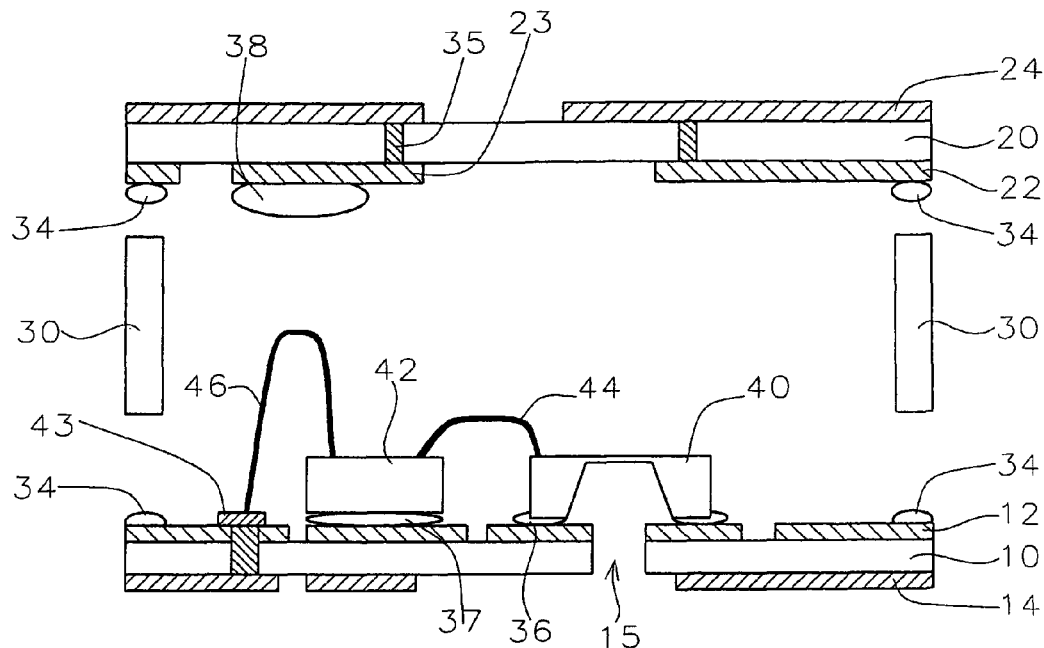
FIG. 3A schematically illustrates in cross-sectional representation an exploded view of a first preferred embodiment of the present invention.

Eleven preferred embodiments of the invention are illustrated in the drawing figures. Referring now more particularly to FIG. 3A, the first preferred embodiment of the present invention will be described. Substrate 10 is illustrated. For example, the substrate can be a two-layer printed circuit board (PCB) 10. The dielectric core layer 10 may be FR4, FR5, or BT, which is laminated with Cu, for example. FR4 laminate is the usual base material from which plated-through-hole and multilayer printed circuit boards are constructed. "FR" means Flame Retardant, and Type "4" indicates woven glass reinforced epoxy resin. Top metal layer 12 and bottom metal layer 14 have been patterned as desired for the package. The PCB has an opening 15 underlying the planned position of the MEMS device.

Metal layers 12 and 14 are preferably copper. The copper layer is typically 25 µm in thickness, but can be more or less, depending on the application. The top metal layer 12 and bottom metal layer 14 may be covered with a layer of solder mask. The surface finish on the area whereby the metal is exposed can be NiAu either for soldering purpose or wire bonding purpose.

The MEMS devices and the IC devices are to be mounted onto the PCB. One MEMS microphone device 40 and one integrated circuit device 42 are illustrated. It will be understood that the MEMS package of the invention comprises at least one MEMS microphone device, but that more than one MEMS device may be included. One or more electronic components, such as IC 42, typically, an application specific IC (ASIC) may be included in the package. Alternately, a single chip with an integrated circuit and MEMS sensing elements integrated thereon may be used.

A top cover 20 is to be placed over the device area of the PCB 10. Metal layers 22 and 24 on either side of the core layer 20 have been patterned as desired for the package. Metal layers 22 and 24 may comprise copper metal lines that may be covered by solder mask layers. The exposed copper metal lines may be coated with a NiAu layer. Vias 35 may be formed through the core 20 to connect top and bottom metal layers, as shown. Spacer 30 will be placed between the PCB 10 and the top cover 20 to form the acoustic chamber around the MEMS device. The spacer may comprise either a metallic block or a polymer block plated with a copper metal layer, which may be plated with a NiAu layer. In more detail, the spacer may comprise a metal ring frame or an organic ring frame with coated conductive films.

Next, adhesives 36 and 37 are dispensed onto the PCB 10 for die attachment. Adhesive 36 used to attach a MEMS device on the substrate is preferably a low modulus adhesive for stress relaxation, such as a silicone-based adhesive.

The MEMS and ASIC dies are pick-n-placed onto the PCB. The MEMS microphone 40 and any other MEMS devices are attached to the PCB with the adhesive 36. Any IC device 42 is attached to the PCB 10 using adhesive 37 in a die-attach process. The IC device 42 is then wire-bonded by gold wires 44 and 46 to the MEMS device 40 and to a gold pad 43 on the substrate, respectively.

In the first preferred embodiment of the invention, the gold wire 46 between the IC device 42 and the gold pad 43 has a high loop profile with sufficient height to allow the gold wire 46 to touch the pad 23 on the bottom side of the top cover 20. Other gold wires have a low loop height. A conductive adhesive 38 is also applied to the pad 23 on the bottom of the top cover 20 above the high loop height wire bond 46 to enable a robust electrical interconnect between the IC device and the pads on the top cover.

Figure 3B:
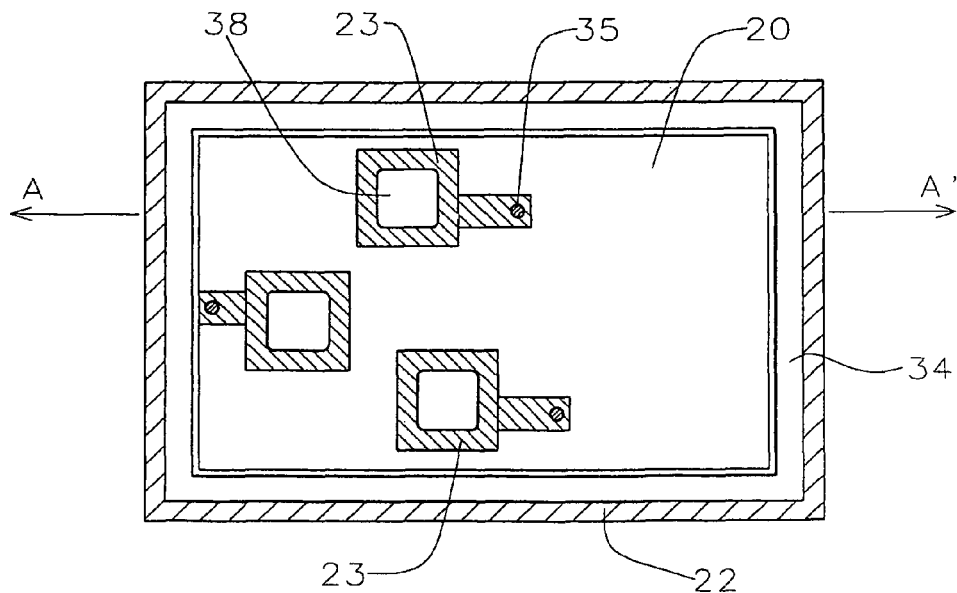
FIG. 3B illustrates in top view the bottom surface of the top cover in embodiments 1-5 of the invention.
Figure 3C:
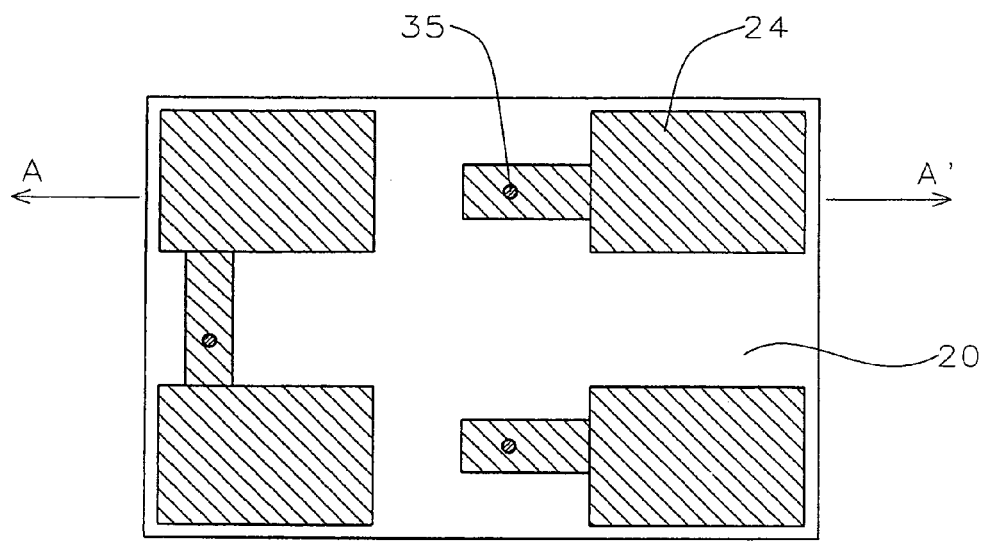
FIG. 3C illustrates in top view the top surface of the top cover in embodiments 1-5 of the invention.
Figure 3D:
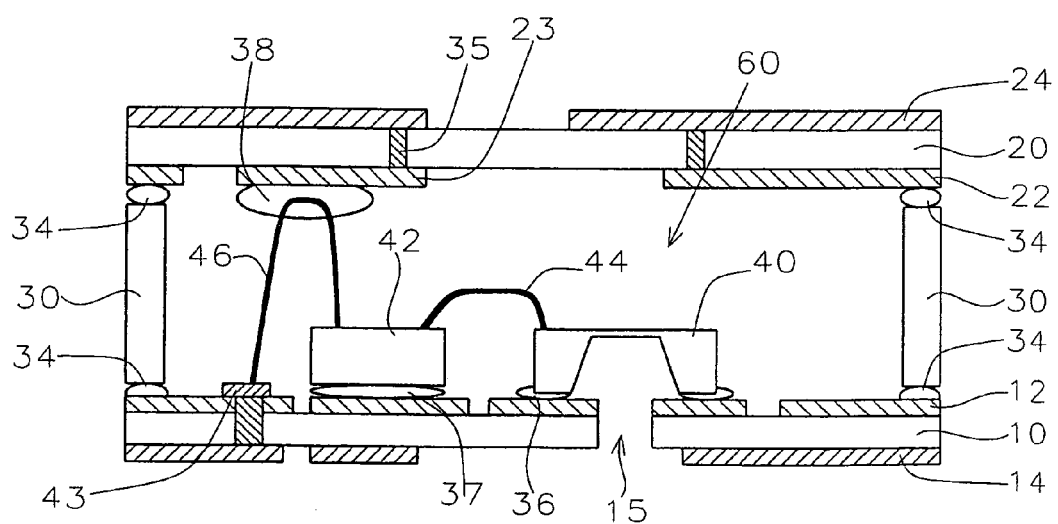
FIG. 3D schematically illustrates in cross-sectional representation a completed MEMS package in a first preferred embodiment of the present invention.

The spacer may be attached to the PCB and the top cover by adhesive or solder paste 34. As shown in FIG. 3D, the top cover 20 is attached to the tops of the spacer 30 using adhesive or solder paste. In practice, the spacer may first be attached to the bottom PCB, by screen printing or dispensing solder paste on the top surface of PCB, placing the spacer with the bottom edges of the spacer touching the solder paste, then using a solder reflow process to complete the attachment. Alternatively, a tape or paste adhesive may be deposited onto the top surface of the PCB and the bottom edges of the spacer attached to the PCB by the adhesive, followed by a curing process.

A conductive adhesive 38 is applied to the pad 23 on the bottom side of the top cover 20 above the high loop height wire bond. Either adhesive or solder paste 34 is also deposited on the metal pad 22 on the bottom side of the top cover. FIGS. 3B and 3C illustrate the bottom side and top side of the top cover 20, respectively, for embodiments 1-5. The cross-section A-A' of these views is shown in FIGS. 3A-7A, 3D, and 4B-7B. Pad 23 in FIGS. 3B and 3D is the pad to which the adhesive 38 is applied.

Next, the top cover is flipped over so that the adhesive 38 is facing toward the bottom PCB. The top cover is then attached to the spacer and sent for curing or a reflow process, depending on whether a solder or an adhesive is used for the attachment. This completes the package that is sealed around the MEMS devices.

Figure 3E:
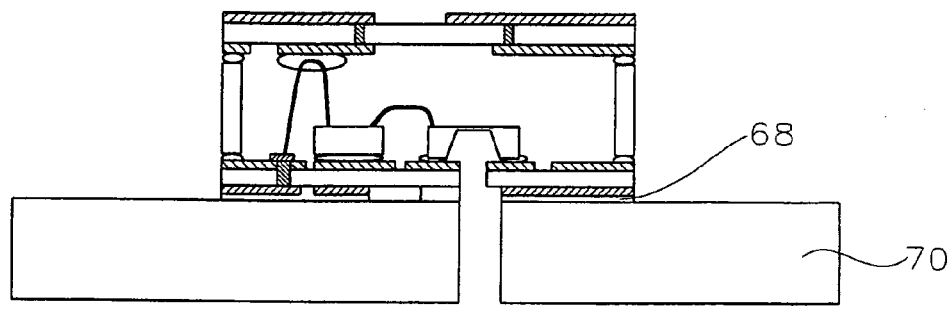
FIG. 3E schematically illustrates in cross-sectional representation a completed MEMS package mounted on a printed circuit board using the bottom side of the package.
Figure 3F:
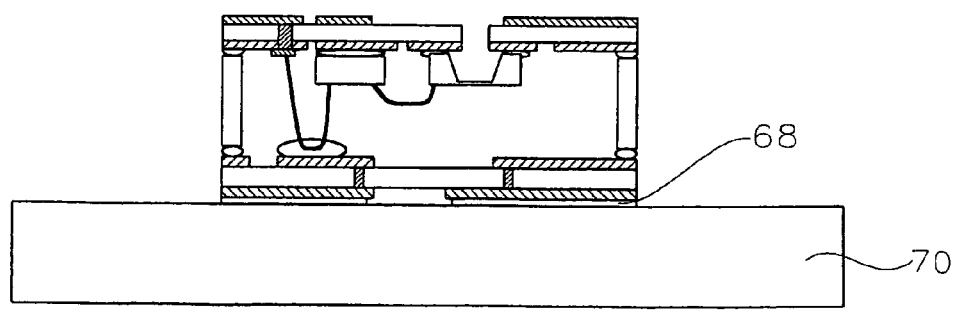
FIG. 3F schematically illustrates in cross-sectional representation a completed MEMS package mounted on printed circuit board using the top side of the package.

The high loop height wire bond 46 attaches to the conductive adhesive 38. This completes the interconnection between the IC chip, the SMT pads 24 on the top of the cover 20, and the SMT pads 14 on the bottom substrate. Acoustic chamber 60 is of sufficient size and much larger than in the prior art. The completed MEMS package is a universal package. That is, the package can further be mounted onto a PCB on either the top or the bottom side of the package, using metal pads 14 or 24. FIG. 3E shows the package mounted onto a PCB 70 on the bottom side of the package. FIG. 3F shows the package mounted onto a PCB 70 on the top side of the package. Mounting is by adhesive or solder or Anisotropic conductive adhesive 68, for example.

Figure 4A:
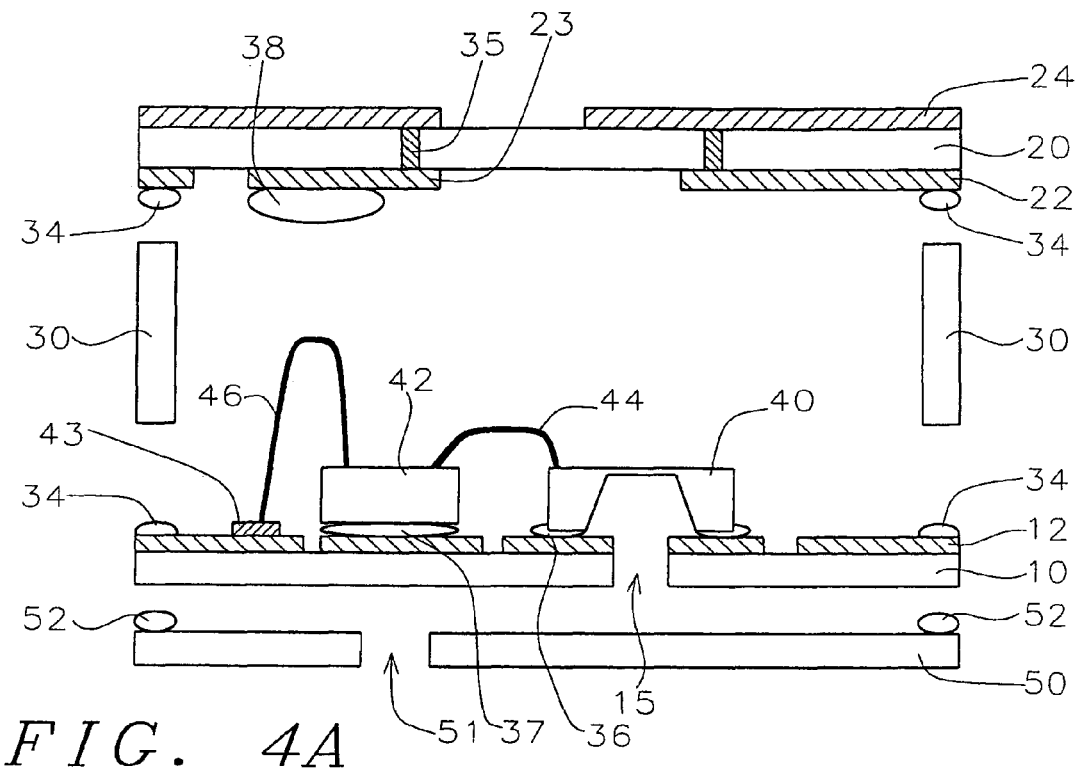
FIG. 4A schematically illustrates in cross-sectional representation an exploded view of a second preferred embodiment of the present invention.

In a second preferred embodiment of the present invention, FIG. 4A illustrates substrate 10. In this embodiment, the substrate 10 may be a printed circuit board on which a top metal trace 12 is formed and patterned as desired for the package. A bottom cover 50 may be a second PCB having an opening 51 not aligned with the opening 15 in the first PCB 10. All other aspects of FIG. 4A are the same as in FIG. 3A.

Figure 4B:
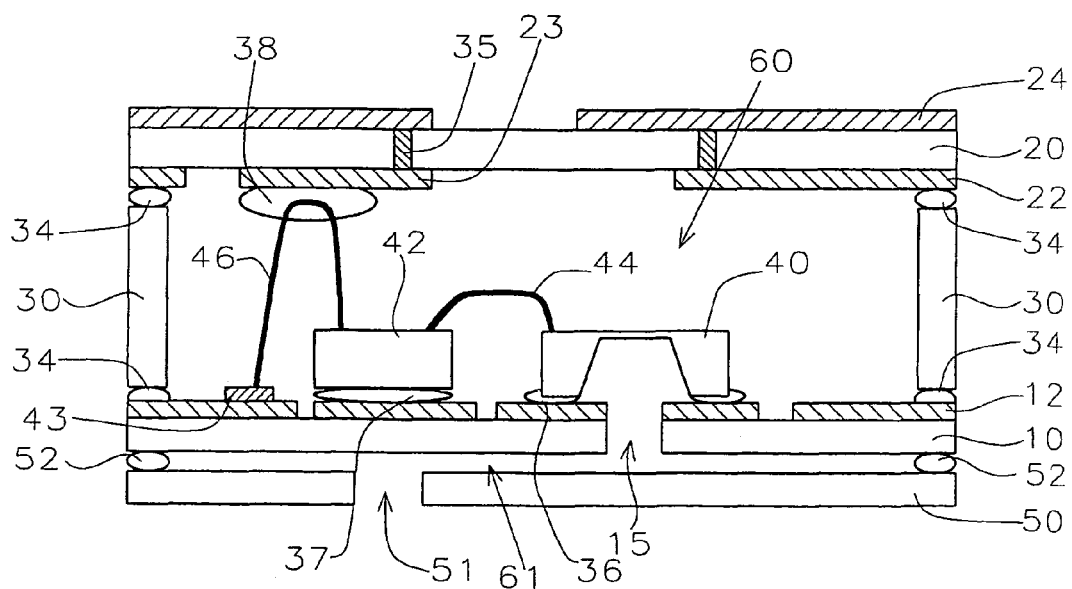
FIG. 4B schematically illustrates in cross-sectional representation a completed MEMS package in a second preferred embodiment of the present invention.

Referring to FIG. 4B, the bottom cover 50 is attached to the substrate 10 using adhesive 52. Again, the high loop height wire bond 46 is attached to the conductive adhesive 38, completing the low-cost electrical interconnection between the IC chip 42 and the SMT pads 24 on the top cover. Acoustic chamber 60 is of sufficient size and much larger than in the prior art. The space between the substrate 10 and the bottom cover 50 forms a hollow chamber 61 that provides an indirect sound channel to the MEMS device, protecting the MEMS device from environmental hazards. The completed MEMS package is a universal package. That is, the package can further be mounted onto a PCB on either the top or the bottom side of the package.

Figure 5A:
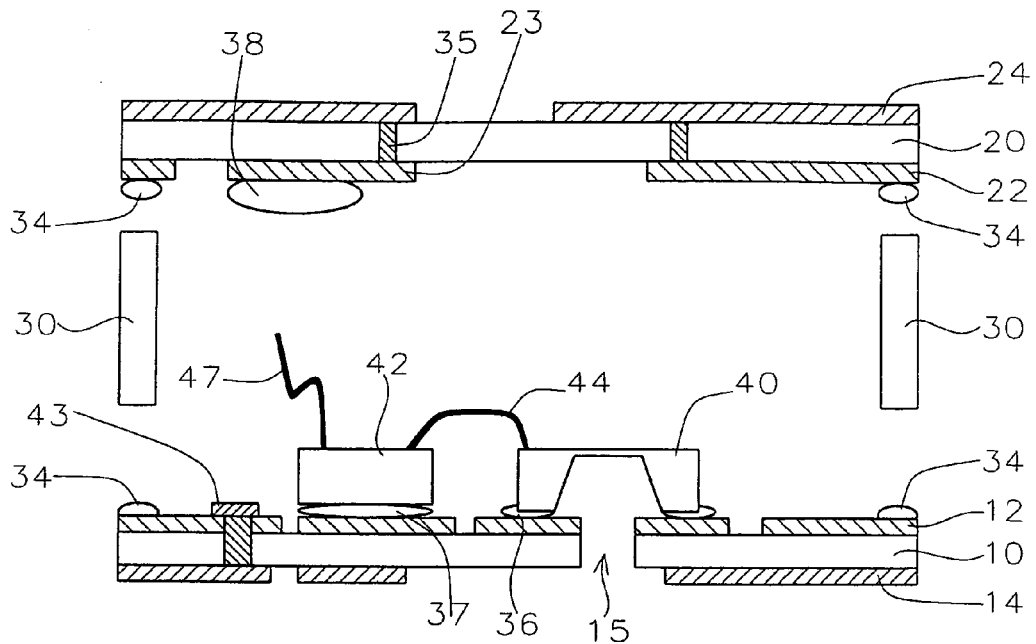
FIG. 5A schematically illustrates in cross-sectional representation an exploded view of a third preferred embodiment of the present invention.
Figure 5B:
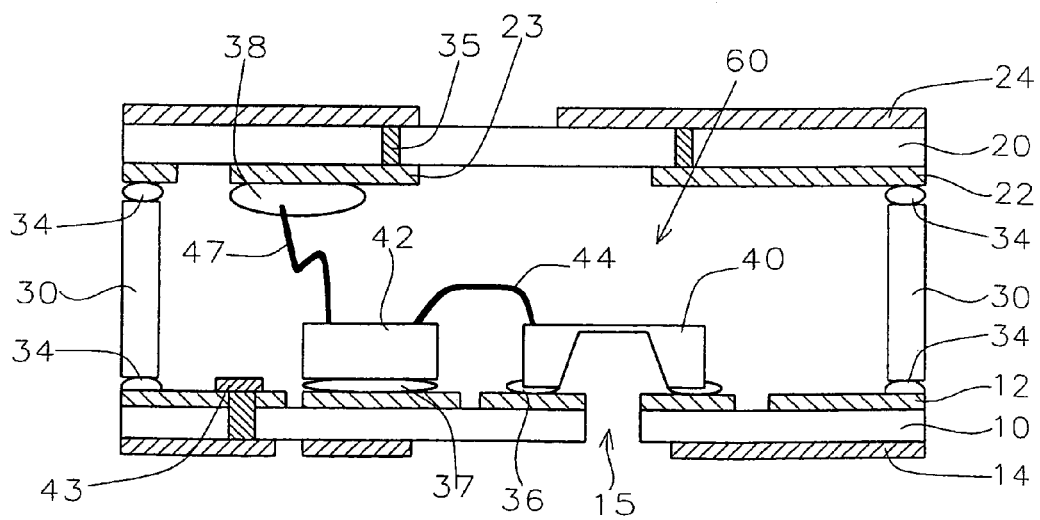
FIG. 5B schematically illustrates in cross-sectional representation a completed MEMS package in a third preferred embodiment of the present invention.

A third preferred embodiment of the present invention is illustrated in FIG. 5A. Everything is the same as in FIG. 3A except that a vertical wire 47 extends upward from the IC 42. The wire 47 may have a vertical or zig-zag loop profile. The vertical wire 47 connects only to the IC 42 on the bottom substrate, and does not connect to a pad on the bottom substrate as in the previous embodiments. As shown in FIG. 5B, the top cover 20 is fixed over the spacer 30 and the substrate 10. The vertical wire 47 attaches to the conductive adhesive, completing the electrical interconnection of the IC chip 42 with the SMT pads on the top cover 20.

Acoustic chamber 60 is of sufficient size and much larger than in the prior art. The MEMS package can be configured to be mounted on the bottom side or the top side of the package to a printed circuit board.

Figure 6A:
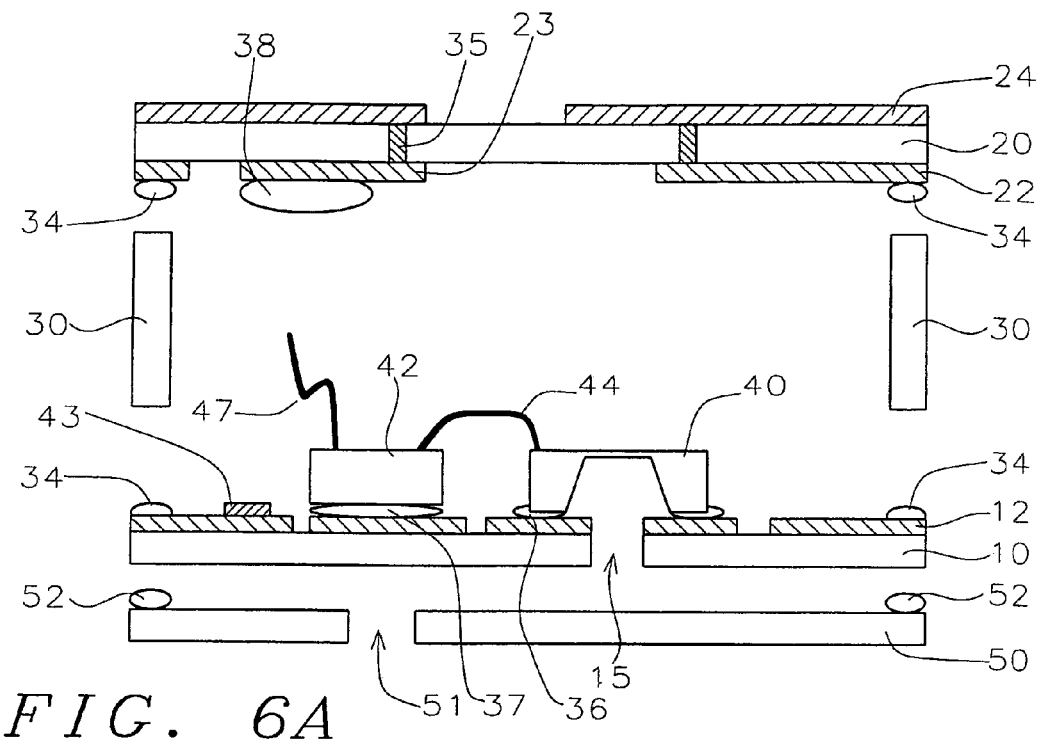
FIG. 6A schematically illustrates in cross-sectional representation an exploded view of a fourth preferred embodiment of the present invention.

A fourth preferred embodiment of the present invention is illustrated in FIG. 6A. In this embodiment, the substrate 10 may be a printed circuit board on which a top metal trace 12 is formed and patterned as desired for the package. A bottom cover 50 may be a second PCB having an opening 51 not aligned with the opening 15 in the first PCB 10. All other aspects of FIG. 6A are the same as in FIG. 5A.

Figure 6B:
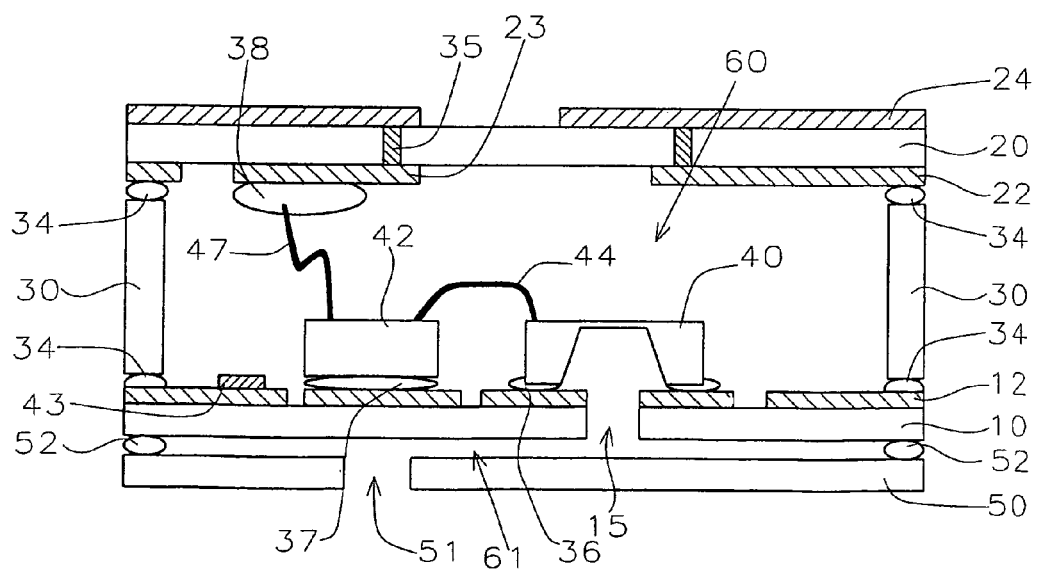
FIG. 6B schematically illustrates in cross-sectional representation a completed MEMS package in a fourth preferred embodiment of the present invention.

Referring to FIG. 6B, the bottom cover 50 is attached to the substrate 10 using adhesive 52. Again, the vertical or zig-zag wire bond 47 connects to the conductive adhesive 38, completing the low-cost electrical interconnection between the IC chip 42 and the SMT pads 24 on the top cover. Acoustic chamber 60 is of sufficient size and much larger than in the prior art. The space between the substrate 10 and the bottom cover 50 forms a hollow chamber 61 that provides an indirect sound channel to the MEMS device, protecting the MEMS device from environmental hazards. The MEMS package can be configured to be mounted on the bottom side or the top side of the package to a printed circuit board.

Figure 7A:
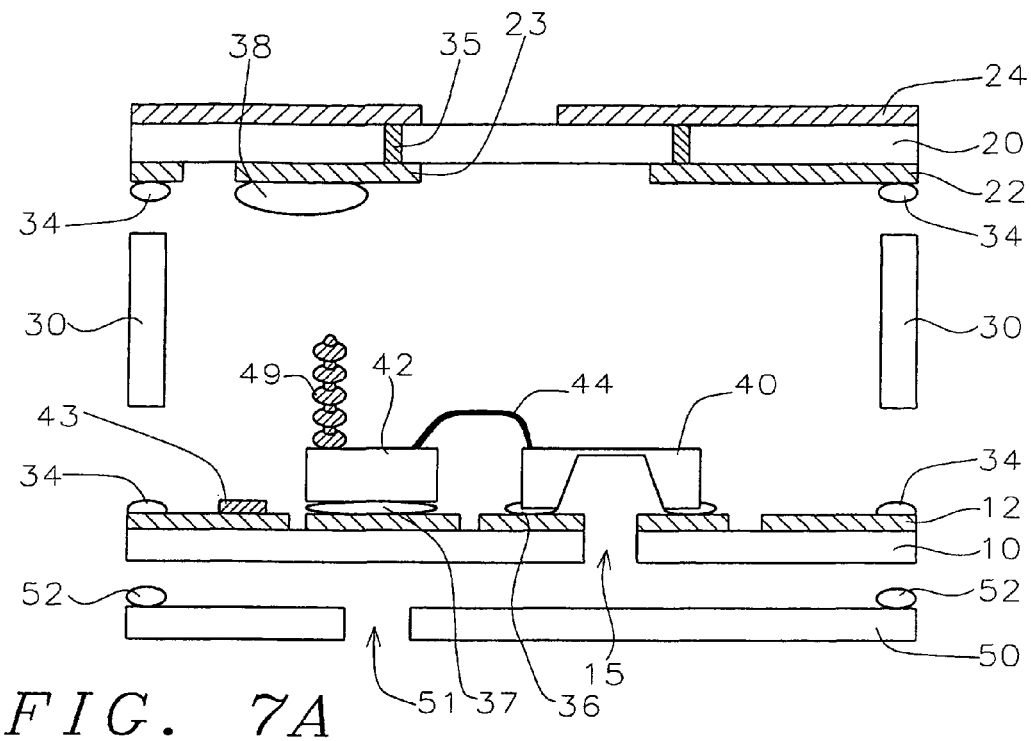
FIG. 7A schematically illustrates in cross-sectional representation an exploded view of a fifth preferred embodiment of the present invention.

A fifth preferred embodiment of the present invention is illustrated in FIG. 7A. In this embodiment, the substrate 10 may be a printed circuit board on which a top metal trace 12 is formed and patterned as desired for the package. A bottom cover 50 may be a second PCB having an opening 51 not aligned with the opening 15 in the first PCB 10.

One or more MEMS devices 40 and one or more IC chips 42 may be attached to the PCB using adhesives 36 and 37. A gold wire bond 44 connects the IC 42 to the MEMS device 40. In this embodiment, a stack of gold stud bumps or balls 49 is deposited on the top of the IC 42. A stud bump is first deposited on the pad on IC chip 42 by a wire bonding process, another stud bump is then deposited on the first stud bump, and the number of bumps is increased until the total height of the stud bumps is sufficient for the top bump to touch the pad 23 on the top cover.

Figure 7B:
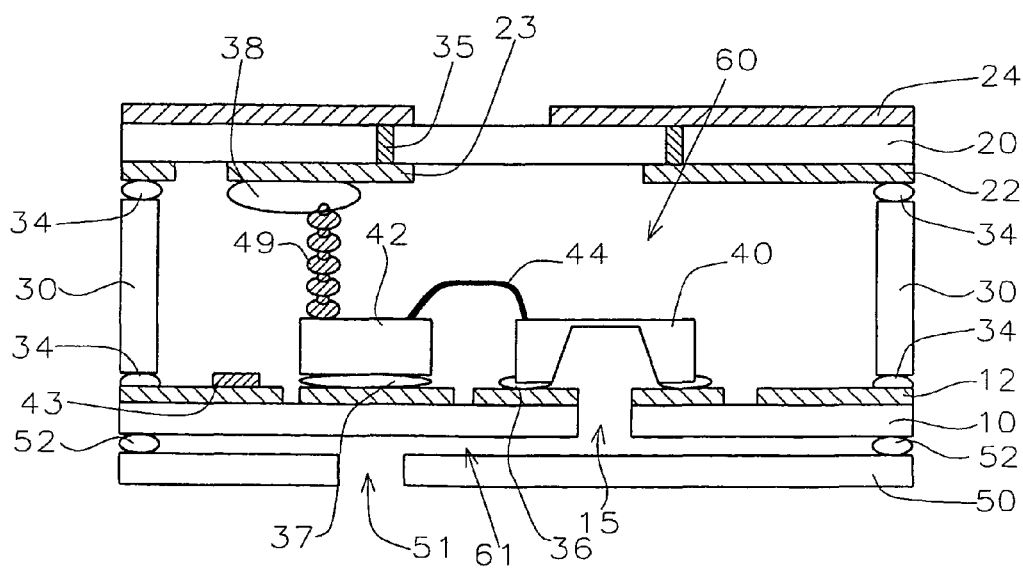
FIG. 7B schematically illustrates in cross-sectional representation a completed MEMS package in a fifth preferred embodiment of the present invention.

A conductive adhesive 38 is also applied to the pad 23 on the bottom of the top cover 20 above the stud bumps 49. The spacer may be attached to the PCB and the top cover by adhesive or solder paste 34. As shown in FIG. 7B, the top cover 20 is attached to the tops of the spacer 30 using adhesive or solder paste. In practice, the spacer may first be attached to the bottom PCB, then sent for curing or a reflow process, depending on whether adhesive or solder paste is used for attaching. Next, the top cover is flipped over so that the adhesive 38 is facing toward the bottom PCB. The top cover is then attached to the spacer and sent for curing or a reflow process. This completes the package that is sealed around the MEMS devices.

The bottom cover 50 is attached to the substrate 10 using adhesive 52. The space between the substrate 10 and the bottom cover 50 forms a hollow chamber 61 that provides an indirect sound channel to the MEMS device, protecting the MEMS device from environmental hazards. The stack of stud bumps 49 attaches to the conductive adhesive 38. This completes the interconnection between the IC chip and the SMT pads 24 on the top of the cover 20. Acoustic chamber 60 is of sufficient size and much larger than in the prior art. The MEMS package can be configured to be mounted on the bottom side or the top side of the package to a printed circuit board.

Figure 8A:
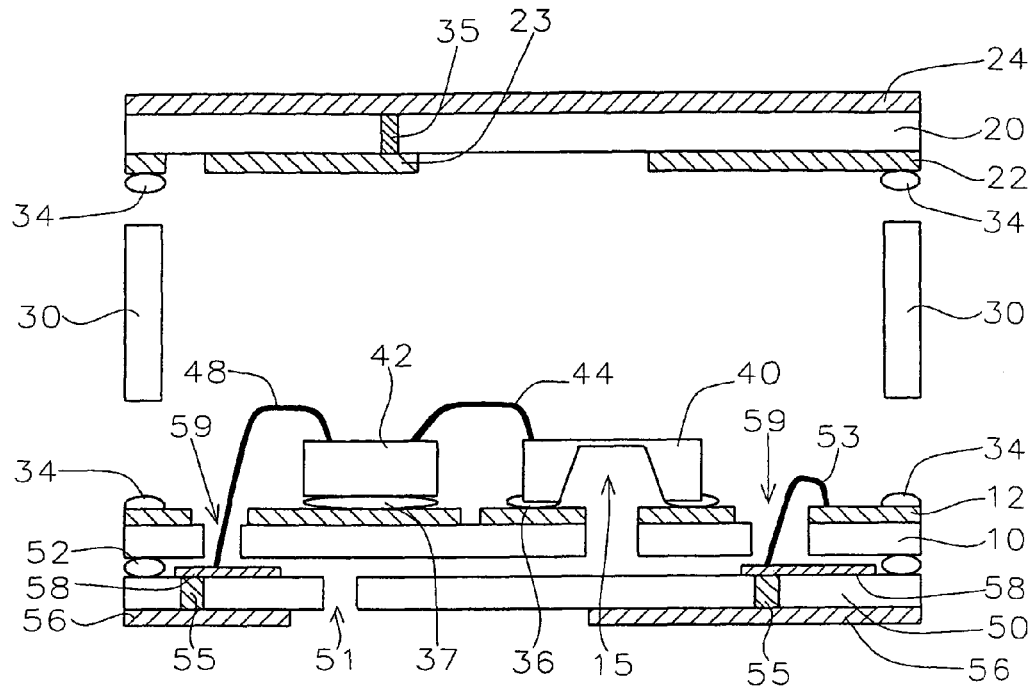
FIG. 8A schematically illustrates in cross-sectional representation an exploded view of a sixth preferred embodiment of the present invention.

A sixth preferred embodiment of the present invention is illustrated in FIG. 8A. In this embodiment, the substrate 10 may be a printed circuit board (PCB) on which a top metal trace 12 is formed and patterned as desired for the package. The PCB has an opening 15 underlying the planned position of the MEMS device. Other openings 59 are formed where connections will be made from devices on the PCB 10 to a bottom cover underlying the PCB 10.

Bottom cover 50 may be a second PCB having an opening 51 not aligned with the opening 15 in the first PCB 10. This PCB 50 may also have metal layers 56 and 58 that have been patterned as desired for the package. Metal layers 56 and 58 may comprise copper metal lines, which may be coated with a NiAu layer. Vias 55 may be formed through the core 50 to connect top and bottom metal layers, as shown. The bottom cover 50 is attached to the first PCB 10 using solder or adhesive 52. The assembly of the bottom cover and the first PCB 10 is sent for curing or a reflow process.

One or more MEMS devices 40 and one or more IC chips 42 may be attached to the PCB 10 using adhesives 36 and 37. A gold wire bond 44 connects to the IC 42 to the MEMS device 40. Another gold wire bond 48 connects the IC chip 42 to a pad 58 on the bottom cover 50 through opening 59 in the PCB 10. Another wire bond 53 may be formed between the metal pad 12 on the PCB 10 and a metal pad 58 on the bottom cover 50 through the opening 59 in the PCB 10. All of these gold wire bonds have low loop height. In this embodiment, there is no connection of wire bonds to the top cover.

Figure 8B:
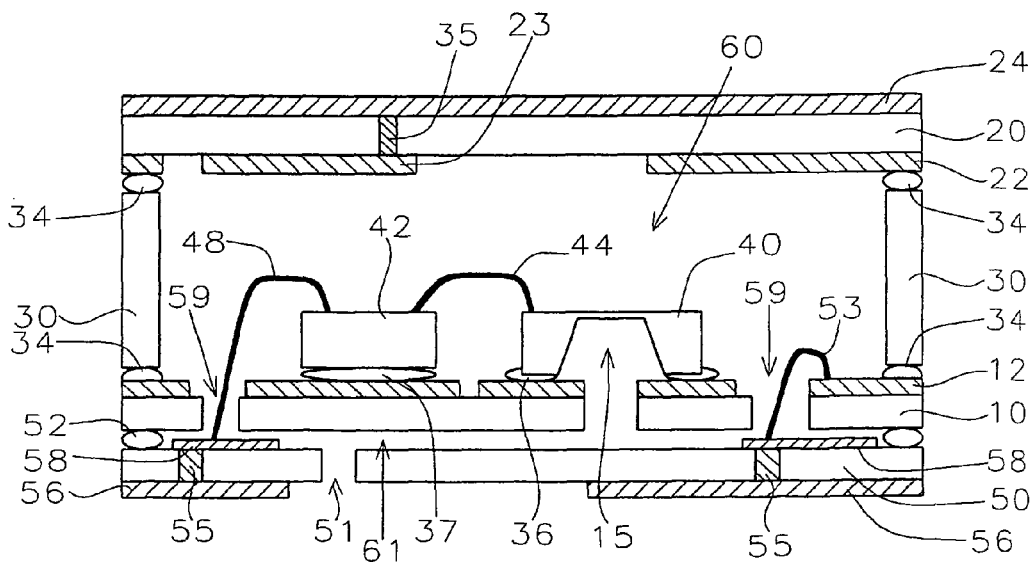
FIG. 8B schematically illustrates in cross-sectional representation a completed MEMS package in a sixth preferred embodiment of the present invention.

The spacer 30 is attached to the bottom PCB 10 using adhesive or solder paste 34. The assembly of the spacer and the bottom PCB is sent for curing or a reflow process. Then, the bottom of the top cover 20 is deposited with a solder paste or adhesive to provide a seal around the package. The top cover 20 is flipped over and attached to the spacer and bottom PCB assembly, then sent for curing or a reflow process. FIG. 8B shows the package after assembly.

The space between the substrate 10 and the bottom cover 50 forms a hollow chamber 61 that provides an indirect sound channel to the MEMS device, protecting the MEMS device from environmental hazards. The wire bond 48 completes the interconnection between the IC chip and the SMT pads 56 on the bottom of the bottom cover 50. The wire bond 53 completes the interconnection between the metal layer 12 on substrate 10 and pads 56/58 on the bottom cover 50.

Acoustic chamber 60 is of sufficient size and much larger than in the prior art. The MEMS package can be configured to be mounted on the bottom side or the top side of the package to a printed circuit board.

Figure 9A:
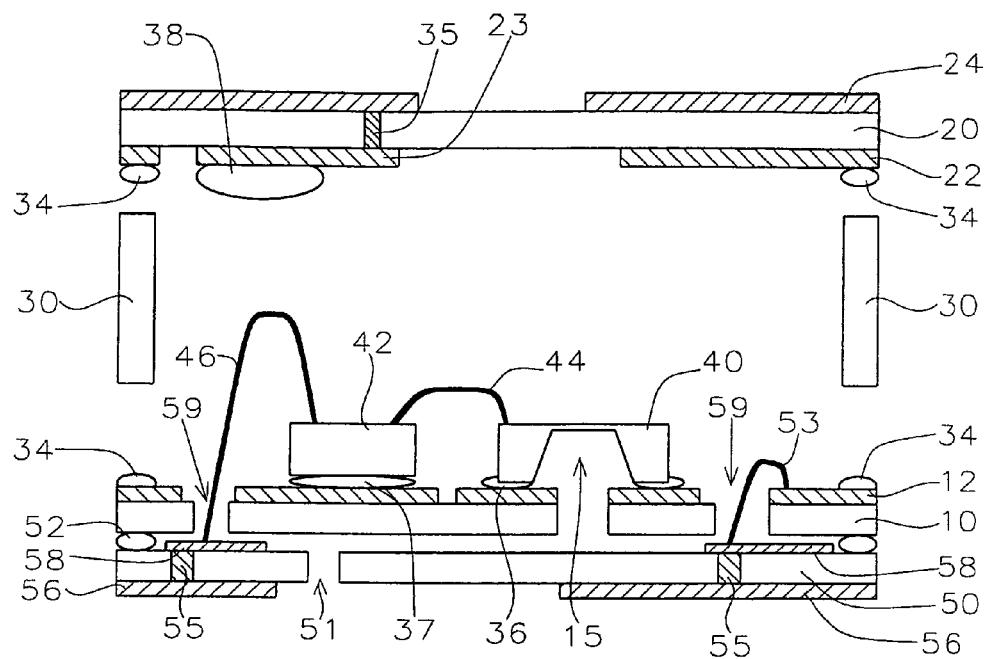
FIG. 9A schematically illustrates in cross-sectional representation an exploded view of a seventh preferred embodiment of the present invention.

A seventh preferred embodiment of the present invention is illustrated in FIG. 9A. This embodiment is the same as the sixth embodiment except that the gold wire bond 46 that connects the IC chip 42 to a pad 58 on the bottom cover 50 through opening 59 in the PCB 10 is a high loop height wire with sufficient height to touch the pad 23 on the bottom of top cover 20. A conductive adhesive 38 is placed on the bottom surface of the top cover 20 above the high loop height wire bond 46.

Figure 9B:
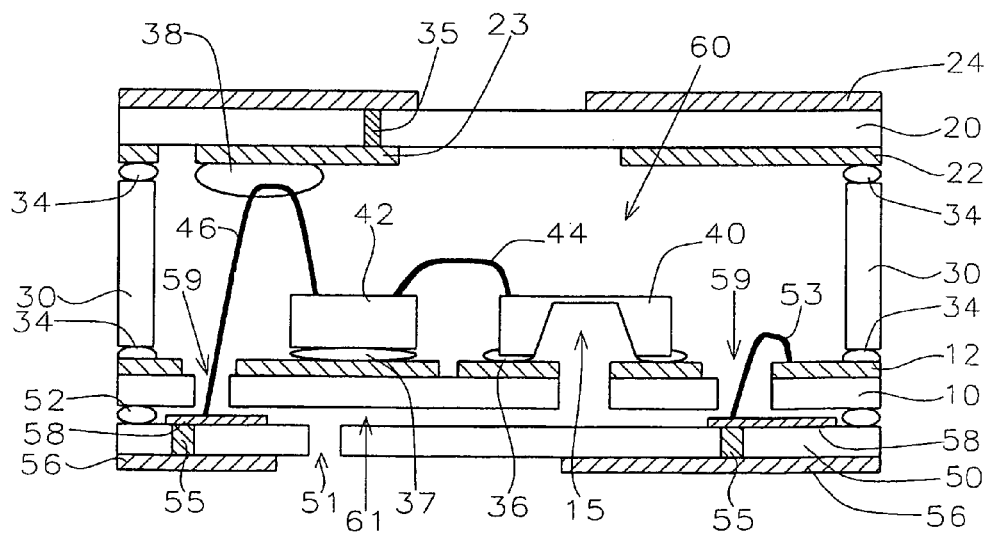
FIG. 9B schematically illustrates in cross-sectional representation a completed MEMS package in a seventh preferred embodiment of the present invention.

The bottom cover 50 is attached to the bottom PCB 10 using solder or adhesive 52. The assembly of the bottom cover 50 and the bottom PCB 10 is sent for curing or a reflow process. The spacer 30 is attached to the bottom PCB 10 using adhesive or solder paste 34. The assembly of the spacer and the bottom PCB 10 is sent for curing or a reflow process. Then, the bottom of the top cover 20 is deposited with a solder paste or adhesive to provide a seal around the package. A conductive adhesive 38 is placed on the pad 23 on the bottom surface of the top cover 20 above the high loop height wire bond 46. The top cover 20 is flipped over and attached to the spacer and bottom PCB assembly, then sent for curing or a reflow process. FIG. 9B shows the package after assembly.

The space between the substrate 10 and the bottom cover 50 forms a hollow chamber 61 that provides an indirect sound channel to the MEMS device, protecting the MEMS device from environmental hazards. The high loop height wire bond 46 attaches to the conductive adhesive 38. The wire bond 46 completes the interconnection between the IC chip, the SMT pads 24 on the top cover 20, and the SMT pads 56/58 on the bottom cover 50. The wire bond 53 completes the interconnection between the metal layer 12 on substrate 10 and pads 56 on bottom cover 50.

Acoustic chamber 60 is of sufficient size and much larger than in the prior art. The MEMS package can be configured to be mounted on the bottom side or the top side of the package to a printed circuit board.

Figure 10A:
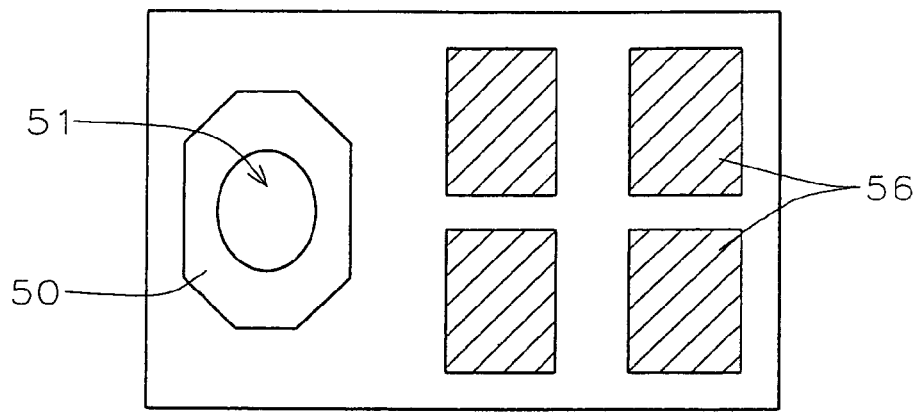
FIG. 10A illustrates in top view the bottom surface of the top cover in embodiments 6-7 of the invention.
Figure 10B:
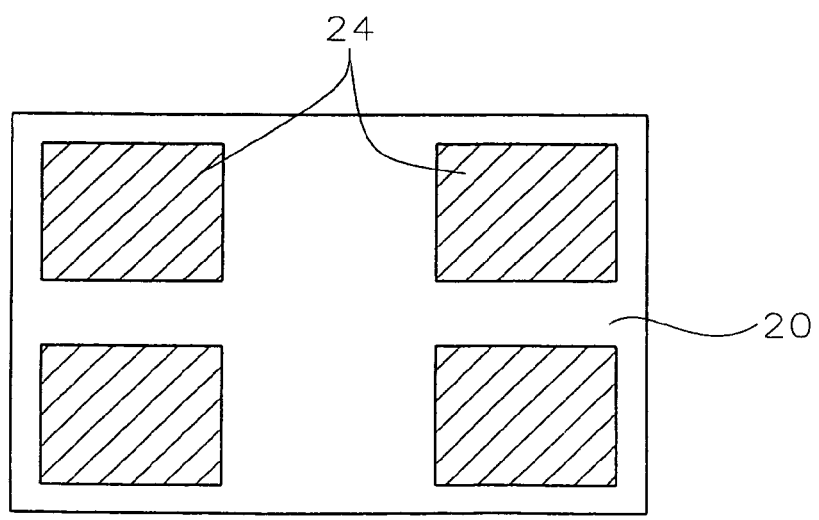
FIG. 10B illustrates in top view the top surface of the top cover in embodiments 6-7 of the invention.

FIG. 10A illustrates the bottom view of the completed package. The sound channel inlet hole 51 is shown opening in the bottom cover 50 having patterned metal layer 56 thereon. FIG. 10B illustrates the top view of the completed package showing top cover 20 having patterned metal layer 24 thereon. Further PCB's may be mounted onto either the top of the package through pads 24 or the bottom of the package through pads 56.

In the embodiments in FIGS. 4B, 6B, 7B, 8B, and 9B, the stacked PCB's 10 and 50 form a hollow chamber 61. In this embodiment, the acoustic chamber 60 is located within the space enclosed by the top cover 20 and the first PCB 10. External fluid, acoustic energy or pressure enters the package through opening 51 in bottom cover 50, and passes through the hollow chamber 61 into the opening 15 into the acoustic chamber 60. The opening 51 is not aligned with the MEMS device so that the MEMS device is protected from external environmental hazards. The acoustic chamber 60 is sufficient to allow diaphragm movement and to minimize acoustic noise.

Figure 11:
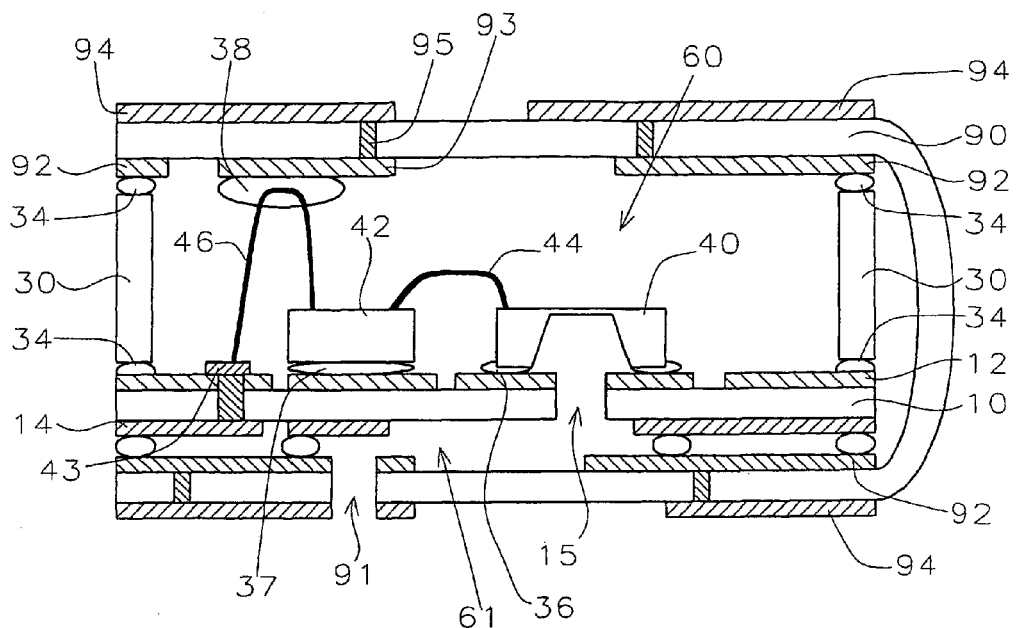
FIG. 11 schematically illustrates in cross-sectional representation a completed MEMS package in an eighth preferred embodiment of the present invention.

In an eighth preferred embodiment of the invention, the substrate 10 may be a rigid substrate having top metal trace 12 and bottom metal trace 14, formed and patterned as desired for the package. The substrate 10 has an opening 15 underlying the planned position of the MEMS microphone, as shown in FIG. 11. One or more MEMS devices 40 and one or more IC chips 42 may be attached to the substrate 10 using adhesives 36 and 37. A gold wire bond 44 connects the IC 42 to the MEMS device 40. Another gold wire bond 46 connects the IC chip 42 to a gold pad 43 on the substrate 10. The gold wire 46 between the IC device 42 and the gold pad 43 has a high loop profile with sufficient height to allow the gold wire 46 to touch the pad 93 on the bottom side of the flexible printed circuit board 90. Other gold wires have a low loop height. A conductive adhesive 38 is also applied to the pad 93 on the bottom of the flexible printed circuit board above the high loop height wire bond 46 to enable a robust electrical interconnects between the IC device and the pads on the flexible printed circuit board.

The spacer 30 may be attached to the rigid substrate 10 and the flexible printed circuit board 90 by adhesive or solder paste 34. As shown in FIG. 11, the flexible printed circuit board 90 is attached to the tops of the spacer 30 using adhesive or solder paste. In practice, the spacer may first be attached to the rigid substrate 10 by screen printing solder paste on the top surface of the rigid substrate, placing the spacer with the bottom edges of the spacer touching the solder paste, then using a solder reflow process to complete the attachment. Alternatively, an adhesive may be deposited onto the top surface of the rigid substrate and the bottom edges of the spacer attached to the rigid substrate by the adhesive, followed by a curing process.

A conductive adhesive 38 is applied to the pad 93 on the bottom side of the flexible printed circuit board 90 above the high loop height wire bond. Either adhesive or solder paste is also deposited on the metal pad 92 on the bottom side of the flexible printed circuit board. Next, the flexible printed circuit board is flipped over so that the adhesive 38 is facing toward the wire bonded devices on the rigid substrate. The flexible printed circuit board is then attached to the spacer and sent for curing or a reflow process, depending on whether a solder or an adhesive is used for the attachment. This completes the package that is sealed around the MEMS devices.

The high loop height wire bond 46 attaches to the conductive adhesive 38. This completes the interconnection between the IC chip and the SMT pads 94 on the top of the flexible printed circuit board. The flexible printed circuit board 90 is further folded over the package and secured on the bottom of the rigid substrate 10 using adhesive wherein a hollow chamber 61 is formed between the rigid substrate and the flexible printed circuit board, wherein a second opening 91 in the flexible printed circuit board allows external fluid, acoustic energy or pressure to enter the MEMS sensor device through the hollow chamber 61 and the first opening 15 underlying the MEMS sensor device, wherein the second opening is not aligned with the first opening. Acoustic chamber 60 is of sufficient size and much larger than in the prior art. The MEMS package is a universal package. That is, the package can further be mounted onto a PCB on either the top or the bottom side of the package, using metal pads on the flexible printed circuit board.

Figure 12:
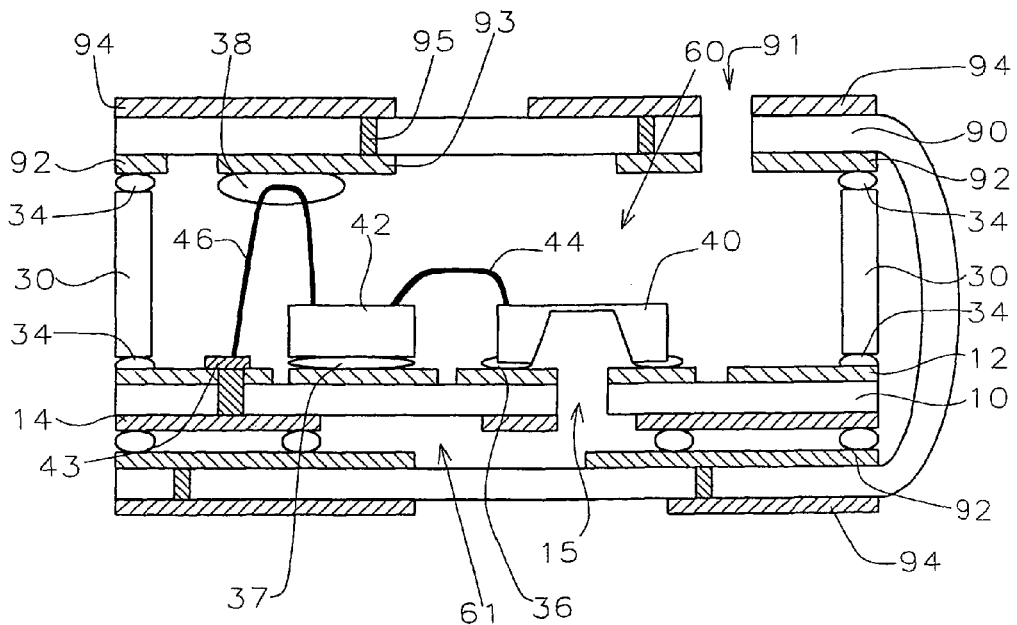
FIG. 12 schematically illustrates in cross-sectional representation a completed MEMS package in a ninth preferred embodiment of the present invention.

In a ninth preferred embodiment of the present invention, FIG. 12 illustrates rigid substrate 10. In this embodiment, the substrate 10 may be a printed circuit board on which a top metal trace 12 and a bottom metal trace 14 are formed and patterned as desired for the package. All other aspects of FIG. 12 are the same as in FIG. 11 except that the opening 91 on the flexible printed circuit board is located on the top of the package.

Referring to FIG. 12, a flexible printed circuit board 90 with a second opening 91 overlies and is attached to, and separated from, the mounting substrate by a spacer forming a housing enclosed by the flexible printed circuit board, the spacer, and the rigid substrate wherein a second opening 91 in the flexible printed circuit board allows external fluid, acoustic energy or pressure to enter the MEMS sensor device. Again, the high loop height wire bond 46 is attached to the conductive adhesive 38, completing the low-cost electrical interconnection between the IC chip 42 and the SMT pads 94 on the flexible printed circuit board. The flexible printed circuit board is further folded over the package and secured on the bottom of the rigid substrate 10 using adhesive wherein a hollow chamber 61 is formed between the rigid substrate and the flexible printed circuit board. Acoustic chamber 60 required for the MEMS device 40 is thus formed by the enclosed hollow chamber 61.

The completed MEMS package is a universal package. That is, the package can further be mounted onto a PCB on either the top or the bottom side of the package.

Figure 13:
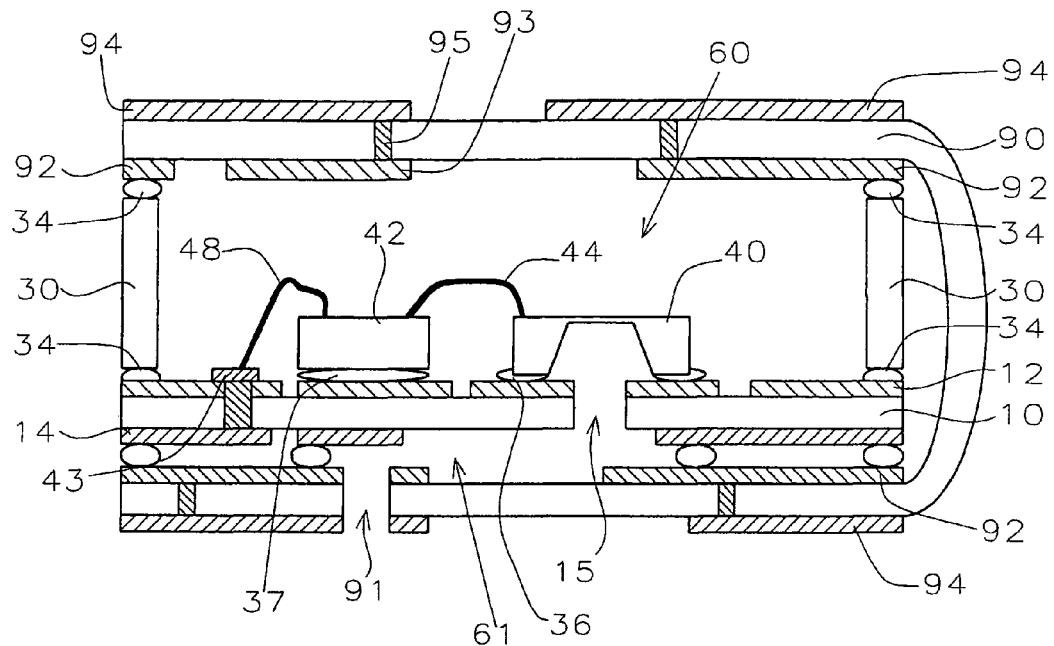
FIG. 13 schematically illustrates in cross-sectional representation a completed MEMS package in a tenth preferred embodiment of the present invention.

A tenth preferred embodiment of the present invention is illustrated in FIG. 13. In this embodiment, the substrate 10 may be a printed circuit board on which a top metal trace 12 and a bottom metal trace 14 are formed and patterned as desired for the package. All other aspects of FIG. 13 are the same as in FIG. 11.

The interconnect between the IC device 42 and the gold pad 43 is formed by a low loop height gold wire 48. The spacer 30 may be attached to the PCB 10 and the flexible printed circuit board 90 by adhesive or solder paste 34. As shown in FIG. 13, the flexible printed circuit board is attached to the tops of the spacer 30 using adhesive or solder paste. In practice, the spacer may first be attached to the bottom PCB, by screen printing solder paste on the top surface of PCB, placing the spacer with the bottom edges of the spacer touching the solder paste, then using a solder reflow process to complete the attachment. Alternatively, an adhesive may be deposited onto the top surface of the PCB and the bottom edges of the spacer attached to the PCB by the adhesive, followed by a curing process.

Either adhesive or solder paste is also deposited on the metal pad 92 on the bottom side of the flexible printed circuit board. Next, the flexible printed circuit board is flipped over so that the adhesive or solder paste is facing toward the bottom PCB. The flexible printed circuit board is then attached to the spacer and sent for curing or a reflow process, depending on whether a solder or an adhesive is used for the attachment. This completes the package that is sealed around the MEMS devices.

The flexible printed circuit board 90 is further folded over the package and secured on the bottom of the PCB using either solder, conductive adhesives, or Acoustic Conductive Film (ACF) wherein a hollow chamber 61 is formed between the PCB and the flexible printed circuit board, wherein a second opening 91 in the bottom cover allows external fluid, acoustic energy or pressure to enter the MEMS sensor device through the hollow chamber and the first opening 15 underlying the MEMS sensor device, wherein the second opening is not aligned with the first opening. Electrical connection between the PCB and the metal pads on the flexible printed circuit board is made by using solder, conductive adhesives, or ACF. Acoustic chamber 60 is of sufficient size and much larger than in the prior art. The completed MEMS package is a universal package. That is, the package can further be mounted onto a PCB on either the top or the bottom side of the package, using metal pads 94 on the flexible printed circuit board.

Figure 14:
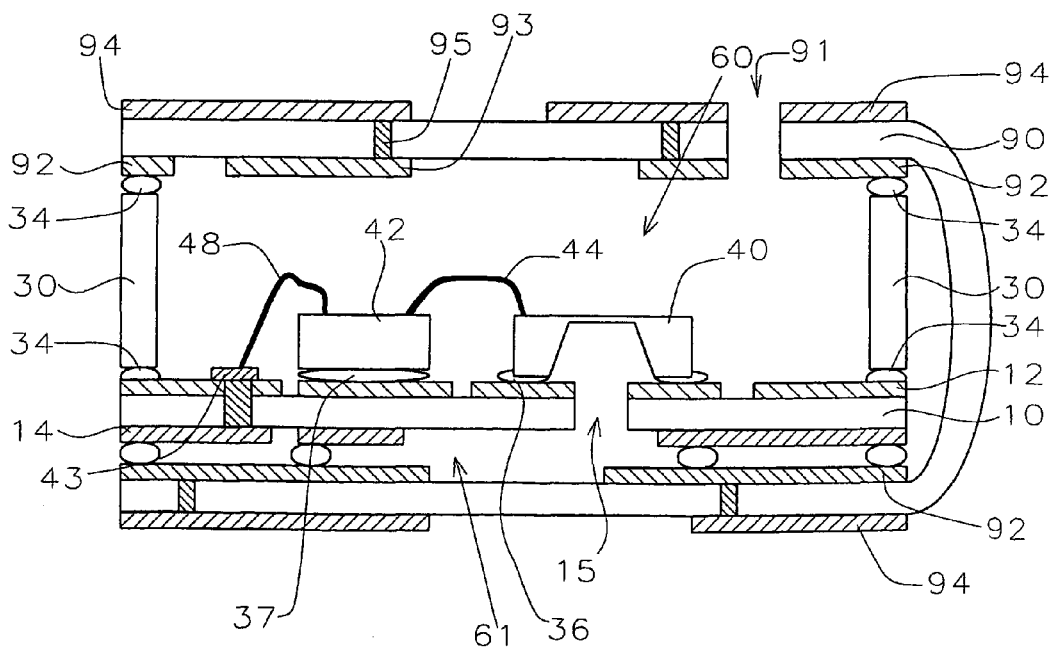
FIG. 14 schematically illustrates in cross-sectional representation a completed MEMS package in an eleventh preferred embodiment of the present invention.

An eleventh preferred embodiment of the present invention is illustrated in FIG. 14. In this embodiment, the substrate 10 may be a printed circuit board on which a top metal trace 12 and a bottom metal trace 14 are formed and patterned as desired for the package. All other aspects of FIG. 14 are the same as in FIG. 13 except that the hole 91 on the flexible printed circuit board 90 is located on the top of the package.

The interconnect between the IC device 42 and the gold pad 43 is formed by a low loop height gold wire 48. The spacer 30 may be attached to the PCB and the flexible printed circuit board by adhesive or solder paste 34. As shown in FIG. 14, the flexible printed circuit board is attached to the tops of the spacer 30 using adhesive or solder paste. In practice, the spacer may first be attached to the bottom PCB by screen printing solder paste on the top surface of PCB, placing the spacer with the bottom edges of the spacer touching the solder paste, then using a solder reflow process to complete the attachment. Alternatively, an adhesive may be deposited onto the top surface of the PCB and the bottom edges of the spacer attached to the PCB by the adhesive, followed by a curing process.

Either adhesive or solder paste is also deposited on the metal pad 92 on the bottom side of flexible printed circuit board. Next, the flexible printed circuit board is flipped over so that the adhesive or solder paste is facing toward the bottom PCB. The flexible printed circuit board is then attached to the spacer and sent for curing or a reflow process, depending on whether a solder or an adhesive is used for the attachment. The opening 91 in the flexible printed circuit board allows external fluid, acoustic energy or pressure to enter the MEMS sensor device. This completes the package that is sealed around the MEMS devices.

The flexible printed circuit board 90 is further folded over the package and secured on the bottom of the PCB using either solder, conductive adhesives, or ACF wherein a hollow chamber 61 is formed between the PCB and the flexible printed circuit board. Electrical connection between the PCB 10 and the metal pads 92/94 on the flexible printed circuit board 90 is by using solder, conductive adhesives, or ACF 34. Acoustic chamber 60 required for MEMS device 40 is thus formed by the hollow chamber 61. The completed MEMS package is a universal package. That is, the package can further be mounted onto a PCB on either the top or the bottom side of the package, using metal pads 94 on the flexible printed circuit board 90.

The present invention provides MEMS packages and methods of manufacturing these packages. The MEMS packages of the invention provide cost-efficient electrical connections between the MEMS device and SMT pads while providing a sufficient back chamber for the MEMS device. Additionally, the MEMS package of the invention is a universal package that can further be mounted to printed circuit boards on either the top or the bottom of the package. Furthermore, in some embodiments of the invention the MEMS element is protected from external environmental hazards.

While the invention has been particularly shown and described with reference to the preferred embodiments thereof, it will be understood by those skilled in the art that various changes in form and details, such as transducer chip with CMOS IC and sensor element integrated thereon, one or more transducer chips and one or more IC chips, may be made without departing from the spirit and scope of the invention.

What is claimed is:

1. A universal MEMS package comprising:
   a mounting substrate on which one or more transducer chips are mounted wherein said mounting substrate has a first opening;

a top cover attached to and separated from said mounting substrate by a spacer forming a housing enclosed by said top cover, said spacer, and said mounting substrate and accessed by said opening;

bonding wires forming electrical connections between one or more of:
said one or more of said transducer chips and said mounting substrate; and
said one or more of said transducer chips and said top cover; and a printed circuit board mounted onto said mounting substrate or onto said top cover.

2. The package according to claim 1 wherein said mounting substrate and said top cover each comprise a dielectric layer and patterned metal layers on both sides of said dielectric layer.

3. The package according to claim 1 wherein said one or more transducer chips comprise an integrated circuit chip and a MEMS sensing element, a single chip with integrated circuit and MEMS sensing elements integrated thereon, or a plurality of integrated circuit chips and a plurality of MEMS sensing chips.

4. The package according to claim 1 wherein said spacer comprises a metal ring frame or an organic ring frame with coated conductive films and is attached to said mounting substrate and to said top cover by a soldering process or by adhesive attachment wherein said adhesive is tape or paste adhesive.

5. The package according to claim 1 wherein said first opening underlies a MEMS sensor device.

6. The package according to claim 1 wherein said electrical connections comprise high loop height bonding wires between said one or more of said transducer chips and said mounting substrate wherein a conductive adhesive bonds said loop of said bonding wires to said top cover.

7. The package according to claim 1 wherein said electrical connections comprise vertical bonding wires between said one or more of said transducer chips and said top cover wherein a conductive adhesive bonds said vertical bonding wires to said top cover.

8. The package according to claim 1 wherein said top cover comprises a first portion of a flexible printed circuit board and wherein a second portion of said flexible printed circuit board is folded under said mounting substrate and attached to said mounting substrate.

9. The package according to claim 8 wherein said folded second portion of said flexible printed circuit board is attached to and electrically connected to said mounting substrate by solder, conductive adhesive, or Anisotropic Conductive Film.

10. The package according to claim 8 wherein said flexible printed circuit board has a second opening in said second portion and wherein a gap is formed between said flexible printed circuit board and said mounting substrate wherein said gap joins said first opening and said second opening wherein said first opening is not aligned with said second opening.

11. The package according to claim 8 wherein a gap is formed between said second portion of said flexible printed circuit board and said mounting substrate wherein said gap underlies said first opening and wherein said flexible printed circuit board has a second opening in said first portion of said flexible printed circuit board.

12. The package according to claim 1 wherein said printed circuit board is mounted onto said mounting surface or onto said top cover by adhesive or solder or Anisotropic conductive adhesive.

13. The package according to claim 1 further comprising:
a bottom cover underlying and joined to said mounting substrate wherein said bottom cover has a second opening and wherein a gap is formed between said bottom cover and said mounting substrate wherein said gap joins said first opening and said second opening and wherein said first opening is not aligned with said second opening;
electrical connections between one or more of:
said one or more transducer chips and said mounting substrate;
said one or more transducer chips and said top cover; and
said one or more transducer chips and said bottom cover; and
pads on outside surfaces of said top and bottom covers used for further attachment to printed circuit boards.

14. The package according to claim 13 wherein said printed circuit board is mounted onto said top cover or onto said bottom cover by adhesive or solder or Anisotropic conductive adhesive.

15. The package according to claim 13 wherein said top cover has a second opening and said bottom cover has no opening.

16. The package according to claim 13 wherein said bottom cover has a second opening and said top cover has no opening, wherein said first opening is not aligned with said second opening.

17. The package according to claim 1 wherein said electrical connections comprise stacked stud bumps between said one or more transducer chips and said top cover wherein a conductive adhesive bonds said stacked stud bumps to said top cover.

18. The package according to claim 13 wherein said electrical connections comprise bonding wires between said one or more transducer chips and said bottom cover through openings in said mounting substrate and between said mounting substrate and said bottom cover through openings in said mounting substrate.

19. The package according to claim 13 wherein said electrical connections comprise:
high loop height bonding wires between said one or more transducer chips and said bottom cover through openings in said mounting substrate wherein a conductive adhesive bonds said loop to said top cover; and
bonding wires between said mounting substrate and said bottom cover through openings in said mounting substrate.

20. A method for fabricating a MEMS package comprising:
providing a mounting substrate having a first opening;
mounting one or more transducer chips on a top surface of said mounting substrate;
mounting a spacer on said top surface of said mounting substrate;
mounting a top cover overlying, attached to, and separated from said mounting substrate by said spacer forming a housing enclosed by said top cover, said spacer, and said mounting substrate and accessed by said first opening;
providing electrical connections between one or more of:
said one or more transducer chips and said mounting substrate; and
said one or more transducer chips and said top cover; and
mounting a printed circuit board onto said top cover or onto said mounting substrate.

21. The method according to claim 20 wherein said first opening underlies a MEMS sensor device.

22. The method according to claim 20 further comprising:
mounting a bottom cover on a bottom surface of said mounting substrate wherein a hollow chamber is formed between said mounting substrate and said bottom cover, wherein a second opening in said bottom cover allows external fluid, acoustic energy or pressure to enter said hollow chamber wherein said second opening is not aligned with said first opening;
providing electrical connections between one or more of:
said one or more transducer chips and said bottom cover; and
said one or more transducer chips and said top cover; and
mounting a printed circuit board onto said top cover or onto said bottom cover.

23. The method according to claim 20 wherein said top cover comprises a first portion of a flexible printed circuit board comprising mounting said first portion of said flexible printed circuit board on said spacer wherein an acoustic chamber is formed between said flexible printed circuit board and said mounting substrate, and wherein a second portion of said flexible printed circuit board is folded over and attached to the bottom of said mounting substrate wherein a hollow chamber is formed between said mounting substrate and said second portion of said flexible circuit board, wherein a second opening in said second portion of said flexible circuit board allows external fluid, acoustic energy or pressure to enter said hollow chamber wherein said second opening is not aligned with said first opening, and further comprising providing electrical connections between one or more of:
said one or more transducer chips and said mounting substrate; and
said one or more transducer chips and said flexible printed circuit board.

24. The method according to claim 20 wherein said top cover comprises a first portion of a flexible printed circuit board comprising mounting said first portion of said flexible printed circuit board on said spacer wherein a second opening in said first portion of said flexible circuit board allows external fluid, acoustic energy or pressure to enter said housing, and wherein a second portion of said flexible circuit board is folded over and attached to the bottom of said mounting substrate wherein a hollow chamber is formed between said mounting substrate and said second portion of said flexible circuit board, and further comprising providing electrical connections between one or more of:
said one or more transducer chips and said mounting substrate; and
said one or more transducer chips and said flexible printed circuit board.

25. The method according to claim 20 wherein said mounting said spacer and said top cover comprises:
screen printing or dispensing solder paste on said top surface of said mounting substrate;
attaching said bottom edges of said spacer to said solder paste on said mounting substrate using a solder reflow process;
screen printing or dispensing solder paste on a bottom surface of said top cover;
placing said top cover on the top of said spacer with said solder paste touching top edges of said spacer; and
attaching said top cover on top edges of said spacer using a solder reflow process.

26. The method according to claim 20 wherein said mounting said spacer and said top cover comprises:
applying adhesive on said top surface of said mounting substrate;
attaching bottom edges of said spacer to said adhesive on said mounting substrate;
applying adhesive on a bottom surface of said top cover; and
attaching said top cover to top edges of said spacer.

27. The method according to claim 20 wherein said providing electrical connections between said one or more transducer chips and said top cover comprises:
bonding wires with sufficient loop height between said one or more transducer chips and said mounting substrate wherein a conductive adhesive bonds said loop of said bonding wires to said top cover.

28. The method according to claim 20 wherein said providing electrical connections between said one or more transducer chips and said top cover comprises:
vertical bonding wires between said one or more transducer chips and said top cover wherein a conductive adhesive bonds said vertical bonding wires to said top cover.

29. The method according to claim 20 wherein said providing electrical connections between said one or more transducer chips and said top cover comprises:
providing stacked stud bumps between said one or more transducer chips and said top cover wherein a conductive adhesive bonds said stacked stud bumps to said top cover.

30. The method according to claim 22 wherein said providing electrical connections between said one or more transducer chips and said bottom cover comprises:
bonding wires between said one or more transducer chips and said bottom cover through openings in said mounting substrate and between said mounting substrate and said bottom cover through openings in said mounting substrate.

31. The method according to claim 22 wherein said providing electrical connections between said one or more transducer chips and said top cover and between said one or more transducer chips and said bottom cover comprises:
bonding wires with sufficient loop height between said one or more transducer chips and said bottom cover through openings in said mounting substrate wherein a conductive adhesive bonds said loop to said top cover; and
bonding wires between said mounting substrate and said bottom cover through openings in said mounting substrate.

32. The method according to claim 23 wherein said mounting said spacer and said flexible printed circuit board comprises:
screen printing or dispensing solder paste on said top surface of said mounting substrate;
attaching said bottom edges of said spacer to said solder paste on said mounting substrate using a solder reflow process;
screen printing or dispensing solder paste on a bottom surface of a first portion of said flexible printed circuit board;
placing said first portion of said flexible printed circuit board on the top of said spacer with said solder paste touching top edges of said spacer;
attaching said first portion of said flexible printed circuit board on top edges of said spacer using a solder reflow process;
screen printing or dispensing adhesives on the bottom of said mounting substrate; and
attaching said second portion of said flexible printed circuit board onto said bottom of said mounting substrate.

33. The method according to claim 23 wherein said mounting said spacer and said flexible printed circuit board comprises:
applying adhesive on said top surface of said mounting substrate;
attaching bottom edges of said spacer to said adhesive on said mounting substrate;
applying adhesive on a bottom surface of a first portion of said flexible printed circuit board;
attaching said first portion of said flexible printed circuit board to top edges of said spacer;
screen printing or dispensing adhesives on the bottom of said mounting substrate; and
attaching said second portion of said flexible printed circuit board onto said bottom of said mounting substrate.

34. The method according to claim 23 wherein said providing electrical connections between said one or more transducer chips and said flexible printed circuit board comprises:
bonding wires with sufficient loop height between said one or more transducer chips and said mounting substrate wherein a conductive adhesive bonds said loop of said bonding wires to said first portion of said flexible printed circuit board.

35. The method according to claim 24 wherein said mounting said spacer and said flexible printed circuit board comprises:
screen printing or dispensing solder paste on said top surface of said mounting substrate;
attaching said bottom edges of said spacer to said solder paste on said mounting substrate using a solder reflow process;
screen printing or dispensing solder paste on a bottom surface of said first portion of said flexible printed circuit board;
placing said first portion of said flexible printed circuit board on the top of said spacer with said solder paste touching top edges of said spacer;
attaching said first portion of said flexible printed circuit board on top edges of said spacer using a solder reflow process;
screen printing or dispensing solder paste or conductive adhesives on the bottom of said mounting substrate; and
attaching said second portion of said flexible printed circuit board onto said mounting substrate.

36. The method according to claim 24 wherein said mounting said spacer and said flexible printed circuit board comprises:
applying adhesive on said top surface of said mounting substrate;
attaching bottom edges of said spacer to said adhesive on said mounting substrate;
applying adhesive on a bottom surface of said first portion of said flexible printed circuit board;
attaching said first portion of said flexible printed circuit board to top edges of said spacer;
screen printing or dispensing solder paste or conductive adhesives on the bottom of said mounting substrate; and
attaching said second portion of said flexible printed circuit board onto said mounting substrate.

37. The method according to claim 24 wherein said providing electrical connections between said one or more transducer chips and said flexible printed circuit board comprises:
bonding wires between said one or more transducer chips and said mounting substrate wherein a conductive adhesive bonds said loop of said bonding wires to said first portion of said flexible printed circuit board;
screen printing or dispensing solder paste or conductive adhesives on the bottom of said mounting substrate; and
attaching said second portion of said flexible printed circuit board onto said bottom of said mounting substrate.

38. The method according to claim 20 wherein said mounting said printed circuit board comprises mounting by adhesive or solder or Anisotropic conductive adhesive.

* * * * *